United States Patent [19]
Rostkovsky et al.

[11] 4,090,190
[45] May 16, 1978

[54] READ ONLY MEMORY

[76] Inventors: Vladimir Stepanovich Rostkovsky; Ljubov Dmitrievna Rostkovskaya, both of ulitsa, 10, korpus 4, kv. 34, Moscow, U.S.S.R.

[21] Appl. No.: 386,095

[22] Filed: Aug. 6, 1973

Related U.S. Application Data

[63] Continuation of Ser. No. 145,305, May 20, 1971, abandoned.

[51] Int. Cl.$^2$ .......................................... H03K 13/252
[52] U.S. Cl. ............................................. 340/347 DD
[58] Field of Search ................. 340/347 DD, 173 SP, 340/166 R; 235/155; 179/18 ET

[56] References Cited

U.S. PATENT DOCUMENTS

| | | | |
|---|---|---|---|
| 3,225,331 | 12/1965 | Steeneck | 340/166 R |
| 3,564,217 | 2/1971 | Bounsall | 340/166 R |

*Primary Examiner*—Charles D. Miller
*Attorney, Agent, or Firm*—Haseltine, Lake & Waters

[57] ABSTRACT

A read-only memory in which the storage-in and storage-out buses are connected to each other in accordance with the significant position "weights" of the stored coded words. At least one intermediate bus with one end connected to one of the storage-in buses and with another end connected, through unilateral conductivity elements connected to each other by like terminals, is connected at least to two storage-out buses forming thereby combinations of different ranks.

9 Claims, 1 Drawing Figure

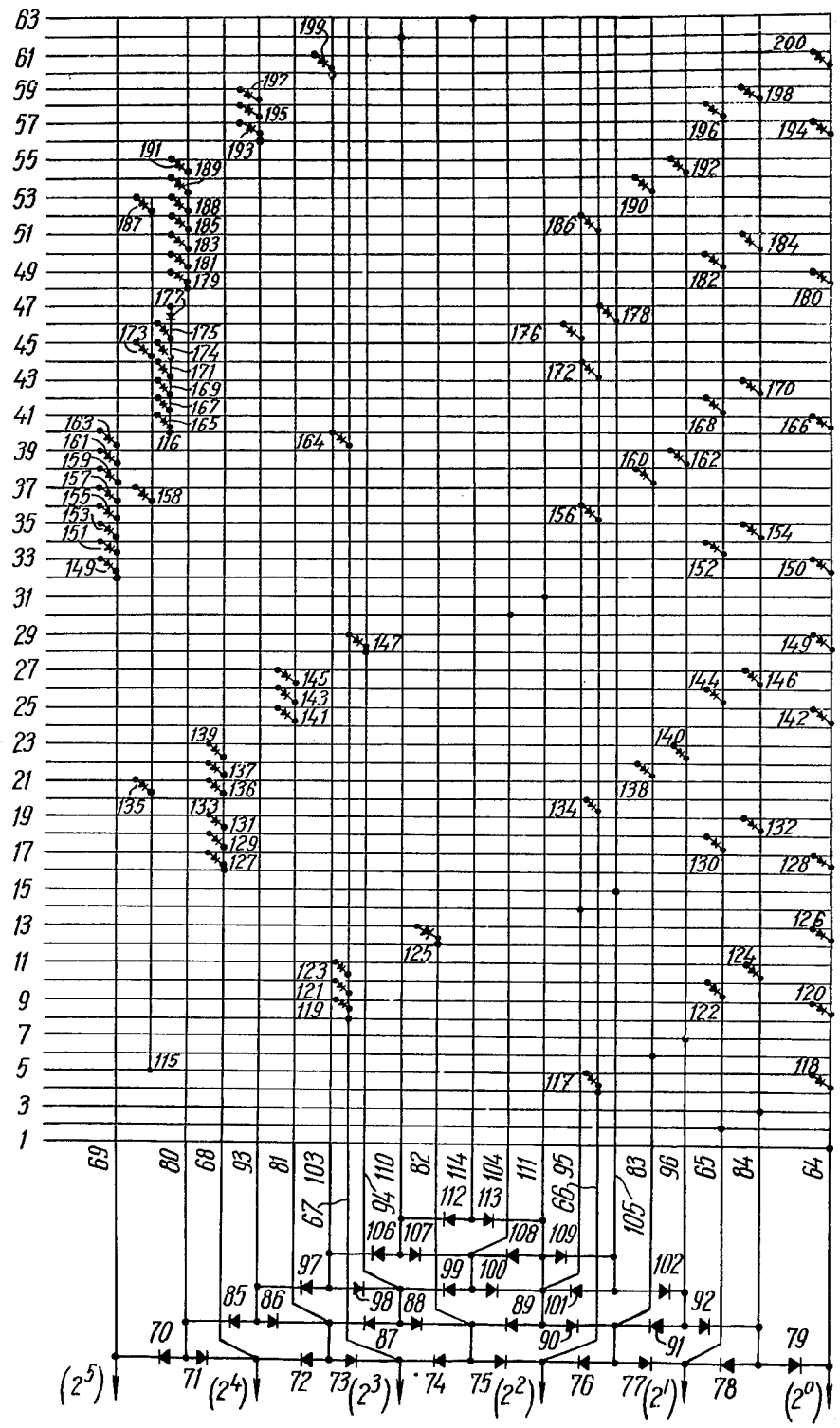

READ ONLY MEMORY

This is a continuation of application Ser. No. 145,305 filed May 20, 1971 now abandoned.

This invention relates to computer engineering and digital automation and also to large capacity memories and peripheral devices for supplying and transmitting information to and from the electronic computers.

Read-only memories utilizing various physical elements are well-known. Among these memories are those utilizing unilateral conductivity elements such as, for instance, diodes. In these memories, the storage-in and storage-out buses are connected in accordance with the significant position "weights" of stored encoded words.

These memories employ storage-in buses which are called number buses (lines), and storage-out buses which are read-only memory outputs. Each number bus stores in one position a word or number.

The storage is carried out with the aid of diodes which connect the number bus to the corresponding position lines so that, for example, in supplying one positive pulse to the number line, positive pulses will simultaneously be produced at the corresponding storage-out bus.

For instance, if a word (number) 101010 (42according to the decimal system) is stored, the number bus is connected by the diodes arranged in the conductive direction from the number bus to the storage-out bus of the higher position of weight 25, the position of weight 23 and the position of weight 21.

Therefore, one number bus is connected to the storage-out ones by as many diodes as the stored word contains "weight" significant position ones.

If the read-only memory employs "n" storage-out buses, it may employ without duplication $2^n$ storage-in buses and employ, thereby, $(n/2) \cdot 2^n = n \cdot 2^{n-1}$ diodes as, on the average, one stored word contains $(n/2)$ ones. (In the binary coding system, a one or zero may appear in a word).

Consequently, a ten position read-only memory may store 1024 words (including zeroes and ones) as a maximum and must employ $10/2 \cdot 1024 = 5120$ diodes. Such a great number of semiconductor elements results in high cost.

In addition, a great number of parallel semiconductor elements are used and this results in low input resistance and, in an operation with pulses, it results in low input impedance. It also requires considerable power for the input signal which is supplied to the number bus and this makes it necessary to have a great number of amplifying elements at the address device outputs and increases power consumption this requiring air conditioning and additional expenses.

Known devices further possess low reliability as only one faulty diode can make the whole read-only memory inoperative.

Further fault detection is hampered by a great number of elements involved and by the low impedance of the device.

An object of the invention is to eliminate the above-mentioned disadvantages.

A further object of the present invention is to provide a read-only memory of unlimited capacity employing a considerably lesser number of unilateral conductivity elements to store one word then heretofore employed.

According to the invention, a read-only memory is provided, in which the storage-in and storage-out buses are connected in accordance with the significant position "weights" of stored code words, said memory employing at least one intermediate bus with one end being connected to one storage-in bus and with the other one being connected through unilateral conductivity elements to at least two storage-out buses forming thereby a combination of first rank. Apart from the aforesaid this memory may employ at least one additional bus with one end being connected to a storage-in busbar and with other end being connected through the unilateral conductivity elements between each other by like terminals, to at least two intermediate buses forming thereby a combination of second rank. As a result of this, each subsequent rank is formed by connecting, at least one additional bus to two additional buses of the preceding, lower, rank and the number of all ranks is lesser by one than the number of the storage-out buses.

The storage-in bus, having a number corresponding to the significant position "weight" of one of the storage-out buses, should be directly connected to this storage-out bus. The storage-in bus, having a number determined by the neighboring positions of two corresponding storage-out buses, should be directly connected to the intermediate bus of the first rank, and the storage-in bus having its number determined by the significant positions of three neighboring storage-out buses, should be directly connected to the corresponding additional bus of the second rank.

The storage-in bus having its number determined by a plurality of the significant position "weights" of two storage-out buses connected to the corresponding intermediate bus, and by the position "weight" of the storage-out bus not adjacent to the said storage-out buses, should be connected to the last storage-out bus and to the said intermediate bus through the corresponding unilateral conductivity elements and the storage-in bus having its number determined by the position "weights" of the storage-out buses connected to two intermediate buses connected to the corresponding additional bus and by the position "weight" of the storage-out bus not adjacent to the said storage-out buses, should be connected through the corresponding unilateral conductivity elements to the last storage-out bus and to the said additional bus.

The storage-in bus having its number determined by a plurality of the significant position "weights" of the storage-out buses connected to two non-adjacent intermediate buses, may be connected to these intermediate buses by means of the corresponding unilateral conductivity elements and the storage-in bus having its number determined by a plurality of the significant position "weights" of the storage-out buses connected to two non-adjacent additional buses may be connected through the corresponding unilateral conductivity elements to these additional buses.

The storage-in bus having its number determined by a plurality of the significant position "weights" of the storage-out buses connected to the additional bus and by a plurality of the significant position "weights" of the storage-out buses not adjacent to the said storage-out buses connected to the intermediate bus, should preferably be connected through the corresponding unilateral conductivity elements to the said intermediate and additional buses.

The read-only memory may employ at least one connecting bus with one end being directly connected to one of the storage-in buses and with the other end being connected through a unilateral conductivity element to the other storage-in bus.

Below, the invention is explained by way of example and with reference to the attached drawing in which the sole figure is an electrical schematic diagram of a read-only memory rated for 64 words (numbers) employing 6 storage-out buses (a word containing zeroes in all positions is not shown).

The device of the known invention may be realized using any of the types of unilateral conductivity elements but, as a matter of convenience, a circuit utilizing diodes is illustrated.

The device illustrated in the drawing employs 63 storage-in buses (without a zero storage-in bus) from the first bus 1 to the sixty-third bus 63 inclusive, connected to six storage-out buses from the sixty-fourth bus 64 to the sixty-ninth bus 69 inclusive, which have "weights" from $2^0$ to $2^5$.

The read-only memory is based on the fact that storage-out buses 64–69 are connected to each other by means of diodes 70–79 connected between each other by like electrodes and connected to neighboring storage-out buses 64–69 by the other like electrodes forming thereby combinations of the first rank.

The combinations of the first rank include intermediate buses 80–84 each of them, for instance, at one side being connected to the common point of two diodes, for example, 70 and 71 and at the other side being directly connected to a storage-in bus, such as for example bus 48 with its number being correspondingly determined by a plurality of the "weight" significant position ones of the storage-out buses 69 and 68 having "weight" $2^5$ and $2^4$.

The introduction of the intermediate buses 80–84 makes it possible to use only ten diodes 70–79 for forming eleven output words.

Intermediate buses 80, 81, 82, 83 and 84 are connected in pairs by means of diodes 85–92 connected to each other by like electrodes and connected to neighboring intermediate buses by the other like electrodes forming thereby combinations of the second rank. The combinations of the second rank include additional buses 93, 94, 95 and 96 each of them being connected at one side to the common point of two such as, for instance, diodes 85 and 86 and through them to the intermediate buses such as, for example, buses 80 and 81 and at the other side directly to storage-in bus 56.

Additional buses 93–96 of the second rank with the aid of diodes 97–102 form combinations of the third rank. Other additional buses 103, 104 and 105 in their turn, with the aid of diodes 106, 107, 108 and 109 form combinations of the fourth rank which includes additional buses 110 and 111. The latters with the aid of diodes 112 and 113 form the combination of the fifth rank which includes additional bus 114.

Each subsequent rank is formed by connecting at least one additional bus to the additional buses of the preceding lower rank.

The total number of ranks is less than the number of storage-out buses by one.

The direct connection of storage-in buses 1, 2, 4, 8, 16 and 32 having their numbers determined by the position "weight" of the corresponding storage-out buses 64, 65, 66, 67, 68 and 69 to the corresponding storage-out bus permits forming at the read-only memory output words including one significant position, namely 000 001, 000 010, 000 100, 001 000, 010 000, 100 000.

This enables saving some more diodes in the device.

The direct connection of storage-in buses 3, 6, 12, 24 and 48 having their numbers determined by a plurality of the significant position "weights" of the corresponding storage-out buses 64–69, to intermediate buses 84, 83, 82, 81 and 80 of the first rank makes it possible to form at the read-only memory output words including in succession two significant positions, namely 000 011, 000 110, 001 100, 011 000, 110 000.

This enables saving also some more diodes in the device.

A greater saving of diodes is achieved by the direct connection of the storage-in bus (for instance, bus 62) having its number determined by a plurality of some neighboring significant positions, to the intermediate bus, for instance (110). This permits to forming at the output a word including in succession a plurality of ones (for instance, 111 110).

The rank number of the combination including one of the corresponding intermediate buses 80, 81, 82, 83 and 84, or additional buses 93, 94, 95, 96, 103, 104, 105, 110, 111 and 114, determines the number of ones greater than the rank number in the output word neighboring positions by one.

For instance, intermediate buses 103, 104 and 105 of the third rank enable forming the words including four ones in the output word neighboring positions, namely 111 100, 011 110 and 001 111.

A considerable saving of diodes is achieved by the connection of the storage-in buses to each other with the aid of connecting buses 115 and 116 being connected from one end to storage-in bus 5 and from the other end through diodes 135, 158 and so forth to the other storage-in buses 21 and 37 forming, at the output, words 010 101, 100 101.

Those of the storage-in buses 1-63, having their numbers formed by pluralities of ones and zeroes, are connected to the corresponding buses 64-69, intermediate buses 80-84, additional buses 93, 94, 95, 96, 103, 104, 105, 110, 111 and 114 and connecting buses 115 and 116 each of them being connected only by means of two diodes corresponding to 117–200. This saves 63 diodes.

Therefore, with the aid of diodes 117–200, storage-in buses 1–63 are connected to the buses of the combinations of the corresponding ranks. The nature of connecting a storage-in bus to a storage-out bus bars is determined by its number which is a digit stored in the read-only memory.

If the number of a storage-in bus, for instance, bus 13 is determined by a plurality of the significant position "weights" of two storage-out buses 66 and 67 correspondingly connected to the corresponding intermediate bus 82, and by the significant position "weight" of the storage-out bus correspondingly not adjacent to said storage-out buses 66 and 67 storage-in bus 13 is connected through diodes 125 and 126 to said intermediate bus 82 and said storage-out bus 64. Word 001 101 is thereby formed.

If the number of a storage-in bus such as, for instance, bus 57, is determined by a plurality of the significant position "weights" of storage-out buses 67, 68 and 69 correspondingly connected through intermediate buses 80, 81 to additional bus 93 and, by the significant position "weight" of storage-out bus 64, correspondingly storage-in bus 57 is connected to additional bus 93 by means of diode 193 and to storage-out bus 64 by means of diode 194.

Thus, word 111 001 and words similar to it in sturcture such as, for instance, 100, 111 and 011 and 101 are formed.

If the number of storage-in bus such as, for instance, bus 51, is determined by a plurality of the significant position "weights" of storage-out buses 69, 68, 65 and 64 correspondingly, connected to two non-adjacent intermediate buses 80 and 84 correspondingly, storage-out bus 51 is connected through diode 183 to intermediate bus 80 and through diode 184 to intermediate bus 84.

Thus, words 110 011 and word similar to it in structure such as, for instance, word, 011 011, are formed.

If the read-only memory employs more than six storage-out buses, for example to form word 1110111 and more words, the storage-in bus with its number being determined by a plurality of the significant position "weights" of the storage-out buses connected to two non-adjacent additional buses, is connected to the said additional buses by means of two diodes.

If the number of the storage-in bus such as, for instance, bus 59, is determined by a plurality of the significant position "weights" of storage-out buses 69, 68 and 67, connected to intermediate bus 93 correspondingly, and by a plurality of the significant position "weights" of storage-out buses 65 and 64 correspondingly connected to additional bus 84 and not being adjacent buses 69, 68 and 67, storage-in bus 59 is connected to bus 93 by means of diode 197 and through diode 198 to bus 84.

Thus word 111 011 and words similar to it in structure such as, for instance, word 110 111, are formed. The read-only memory operates as follows.

Suppose number 46 should be selected from the read-only memory. To do this, a positive polarity request signal is applied to storage-in bus 46. This signal passing through diode 175, connecting bus 116 is applied to storage-in bus 40 and through diode 164 to storage-out bus 67. It is simultaneously applied from storage-in bus 40 through diode 163 to storage-out bus 69. This request signal is applied from storage bus 46 through diode 176 to additional bus 95 and through diodes 89 and 90 to intermediate buses 82 and 83 and from them through diodes 74, 75, 76 and 77 to storage-out buses 67, 66 and 65.

As a result of this, signals 101 110 forming required number 46 will be produced across storage-out buses 64–69.

As seen, the request signal is applied, particularly, to storage-out bus 67 in two ways which is the realization of the duplicating principle. This increases the reliability of the read-only memory as a whole.

Using the considered device as a base a number of devices may be constructed. All these devices are constructed from the considered above by exluding a number of storage-in and storage-out buses.

The binary-decimal encoder is of the greatest interest. The binary-decimal encoder employs storage-buses 1-9 correspondly, storage-out buses 64, 65, 66 and 67, intermediate buses 83 and 84, additional buse 95 and diodes 76, 77, 78, 79, 91, 92, 117, 118, 119 and 120 correspondingly. This encoder employs 10 diodes in all instead of 15 diodes according to the known circuits.

This encoder is used in various key devices for electronic computers.

The proposed device realizes all the number range of the natural series $2^n$ and requires a number of diodes equal to $2^{n+1} - 2(n+1)$.

For the considered read-only memory in which $n = 6$, the number of diodes is equal to $2^7 - 2.7 = 144$; i.e., less than 2 diodes on the average are needed to form an number possible within the given range.

The known device requires 192 diodes for its realization; i.e., by 78 diodes. Upon increasing the memory position and the memory capacity correspondingly, the diode economy is of a progressive nature.

Therefore, for a device with $n = 10$, the economy is equal to $5.2^{10} - (2^{11} - 2.12) = 3\ 096$ diodes.

As connected in parallel to each storage-in bus are not more than two diodes, the input impedance of this circuit is considerably greater than that of the known circuits and it, in its turn, requires less consumed power from the input circuit a lesser number of transistors correspondingly. The fault in one diode (breakdown) makes a part of the memory inoperative as the whole memory is composed of a number of subunits connected by means of diodes which localize the effect of one faulty unit.

As this memory employs a considerably lesser number of elements, the memory, as a whole, becomes more reliable in comparision with known memories.

The proposed device permits constructing a number of devices, which serve to encode information in which a lesser number of diodes will be employed in comparison with the known devices.

What is claimed is:

1. A read-only memory comprising a sequence of storage-in buses; a plurality of storage-out buses representing respectively $2°, 2^1 \ldots 2^n$, said storage-out buses being respectively connected to corresponding ones of said sequence of storage-in buses, pairs of diodes including anodes and cathodes and junctions connecting said anodes, the cathodes of each pair being connected to selected of said storage-out buses of adjacent order, intermediate buses of a first rank being connected between said junctions and selected of said storage-in buses, further pairs of diodes including anodes and cathodes and junctions connecting the latter said anodes, further intermediate buses of a second rank connected between the latter said junctions and selected of said storage-in buses, additional pairs of diodes and additional intermediate buses being connected in pyramidal relationship of further sequential ranks until only one said additional intermediate bus is connected as a final rank to one of said storage-in buses, and further diodes interconnecting selected of said storage-in buses with said storage-out buses such that said storage-out buses operating in conjunction with said intermediate buses are adapted to express a sequence of digital numbers with a minimal number of diodes and thereby with increased reliability.

2. A read-only memory comprising storage-in buses; unilateral conductivity elements; storage-in buses connected to the first said storage-in buses by means of the said unilateral conductivity elements in accordance with the significant position "weights" of stored coded words; at least one intermediate bus directly connected to one of said storage-in buses; storage-out buses; at least two other unilateral conductivity elements having two pairs of like terminals and being connected to each other by one of said pairs of like terminals to form a junction connected to the other end of the said intermediate bus and with the other terminals of the latter said elements connected to the storage-out buses, forming thereby a combination of first rank, at least one additional bus directly connected to one of the said storage-in buses; at least two other unilateral conductivity elements having two pairs of like terminals and being connected to each other by one of said pairs of like terminals to form a junction connected to the other end of the said additional bus and with the other terminals of the latter said elements connected to thecorresponding said intermediate buses forming thereby a combination of second rank, and at least one subsequent rank being formed including at least one further bus connected to two additional buses of the preceding lower rank, the number of all ranks being less that that of the storage-out buses by one.

3. A read-only memory according to claim 2 in which the storage-in bus having a number corresponding to the significant position "weight" of one of said storage-out buses, is directly connected to the latter said one storage-out bus; the storage-in bus having a number determined by a plurality of the neighboring positions of two corresponding storage-out buses, being connected to the intermediate bus of the first rank and the storage-in bus having a number determined by a plurality of the significant positions of three neighboring of the above-said storage-out buses being directly connected to the corresponding additional bus of the second rank.

4. A read-only memory according to claim 3 in which the storage-in bus having a number determined by a plurality of the significant position "weight" of two said storage-out buses connected to the corresponding intermediate bus and by the positin "weight" of the storage-out not adjacent the said storage-out buses, is connected through the corresponding unilateral conductivity element to the last said storage-out bus and to the said intermediate bus.

5. A read-only memory according to claim 4 in which the storage-in bus having a number determined by a plurality of the position "weights" of the storage-out buses connected to two intermediate buses connected to the corresponding additional bus, and by the position "weight" of the storage-out bus not adjacent the said storage-out buses, is connected through the corresponding unilateral conductivity elements to the last said storage-out bus and the said additional bus.

6. A read-only memory according to claim 5 in which the storage-in bus, having a number determined by a plurality of the significant position "weights" of the said storage-out buses connected to two non-adjacent intermediate buses, is connected to these intermediate buses by means of the corresponding unilateral conductivity elements.

7. A read-only memory according to claim 6 in which the storage-in bus, having a number determined by a plurality of the significant position "weights" of the said storage-out buses bonded to two non-adjacent additional buses, is connected through the corresponding unilateral conductivity elements to these additional buses.

8. A read-only memory according to claim 7 in which the storage-in bus, having a number determined by a plurality of the significant position "weights" of the said storage-out buses bonded to the additional bus, and by a plurality of the significant position "weights" of the storage-out buses not adjacent the said storage-out buses connected to the intermediate bus, is connected through the corresponding unilateral conductivity elements to the said intermediate and additional buses.

9. A read-only memory according to claim 8 comprising at least one connecting bus directly connected to one of the said buses and connected through a unilateral conductivitly element to the other storage-in bus.

* * * * *